(12) United States Patent
Liu et al.

(10) Patent No.: US 11,150,276 B2
(45) Date of Patent: Oct. 19, 2021

(54) CURRENT DETECTION DEVICE

(71) Applicants: Kabushiki Kaisha Toshiba, Tokyo (JP); Toshiba Electronic Devices & Storage Corporation, Tokyo (JP)

(72) Inventors: Jia Liu, Yokohama Kanagawa (JP); Toshihiro Tsujimura, Ota Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 112 days.

(21) Appl. No.: 16/518,248

(22) Filed: Jul. 22, 2019

(65) Prior Publication Data

US 2020/0292592 A1 Sep. 17, 2020

(30) Foreign Application Priority Data

Mar. 14, 2019 (JP) ............................... JP2019-046679

(51) Int. Cl.
*G01R 33/09* (2006.01)
*G01R 19/15* (2006.01)
*G01R 33/07* (2006.01)

(52) U.S. Cl.
CPC ............. *G01R 19/15* (2013.01); *G01R 33/07* (2013.01); *G01R 33/093* (2013.01)

(58) Field of Classification Search
CPC ......................... G01R 19/15; G01R 33/07–098
See application file for complete search history.

(56) References Cited

U.S. PATENT DOCUMENTS

| 5,736,846 A * | 4/1998 | Floru ..................... G01R 15/18 324/127 |
| 6,271,744 B1 * | 8/2001 | McCarthy ............ G01R 15/207 257/E27.005 |
| 10,145,908 B2 | 12/2018 | David et al. |
| 10,573,803 B1 * | 2/2020 | Hall ........................ H01L 43/14 |
| 2006/0033487 A1 * | 2/2006 | Nagano ................ G01R 15/202 324/117 H |

(Continued)

FOREIGN PATENT DOCUMENTS

| JP | H06-103323 B2 | 12/1994 |
| JP | 2016-192516 A | 11/2016 |
| JP | 6427184 B2 | 11/2018 |

*Primary Examiner* — Patrick Assouad
*Assistant Examiner* — Demetrius R Pretlow

(57) ABSTRACT

Provided is a current detection device including: a first board; a second board provided above the first board in parallel to the first board; a magnetic measurement element provided between the first board and the second board; a first coil having at least one of a first wire provided on the first board or a second wire provided on the second board and having a first connection conductor connected to the first wire provided on the first board or the second wire provided on the second board; and a second coil having at least one of a third wire provided on the first board or a fourth wire provided on the second board and having a second connection conductor connected to the third wire provided on the first board or the fourth wire provided on the second board, the second coil being connected to the first coil such that magnetic fields generated in the first coil and the second coil by a current for electrically conducting the first coil and the second coil have the same direction.

20 Claims, 10 Drawing Sheets

(56) References Cited

U.S. PATENT DOCUMENTS

| | | | | |
|---|---|---|---|---|
| 2006/0114098 A1* | 6/2006 | Shoji | .................... | G01R 15/205 |
| | | | | 338/32 R |
| 2006/0145690 A1* | 7/2006 | Shoji | .................... | G01R 33/093 |
| | | | | 324/207.21 |
| 2008/0048643 A1* | 2/2008 | Delevoye | ............... | G01R 33/04 |
| | | | | 324/117 R |
| 2008/0094162 A1* | 4/2008 | Schaerrer | ............. | G01R 15/185 |
| | | | | 336/178 |
| 2011/0221436 A1* | 9/2011 | Ichinohe | ............... | G01R 33/09 |
| | | | | 324/252 |
| 2013/0119975 A1* | 5/2013 | Nakajima | .............. | G01R 19/20 |
| | | | | 324/117 R |
| 2013/0221959 A1* | 8/2013 | Oki | ...................... | G01R 15/207 |
| | | | | 324/258 |
| 2015/0177286 A1* | 6/2015 | Fuji | ........................ | G01R 22/06 |
| | | | | 324/144 |
| 2016/0231364 A1* | 8/2016 | Nejatali | .................. | H02J 7/025 |
| 2017/0356934 A1* | 12/2017 | Hurwitz | ............. | G01R 19/0092 |
| 2018/0143269 A1* | 5/2018 | Deak | .................. | G01R 33/0052 |
| 2019/0107564 A1* | 4/2019 | Amano | ............. | G01R 19/0092 |
| 2019/0154733 A1* | 5/2019 | Joo | ......................... | G01R 15/18 |
| 2019/0250221 A1* | 8/2019 | Vorndran | ........... | G01R 19/0092 |
| 2019/0339306 A1* | 11/2019 | Ichinohe | ............. | G01R 15/205 |
| 2020/0141983 A1* | 5/2020 | Glaser | ................. | G01R 15/181 |
| 2020/0182913 A1* | 6/2020 | Kim | ....................... | G01R 15/18 |
| 2021/0003616 A1* | 1/2021 | Miwa | .................. | G01R 15/205 |

\* cited by examiner

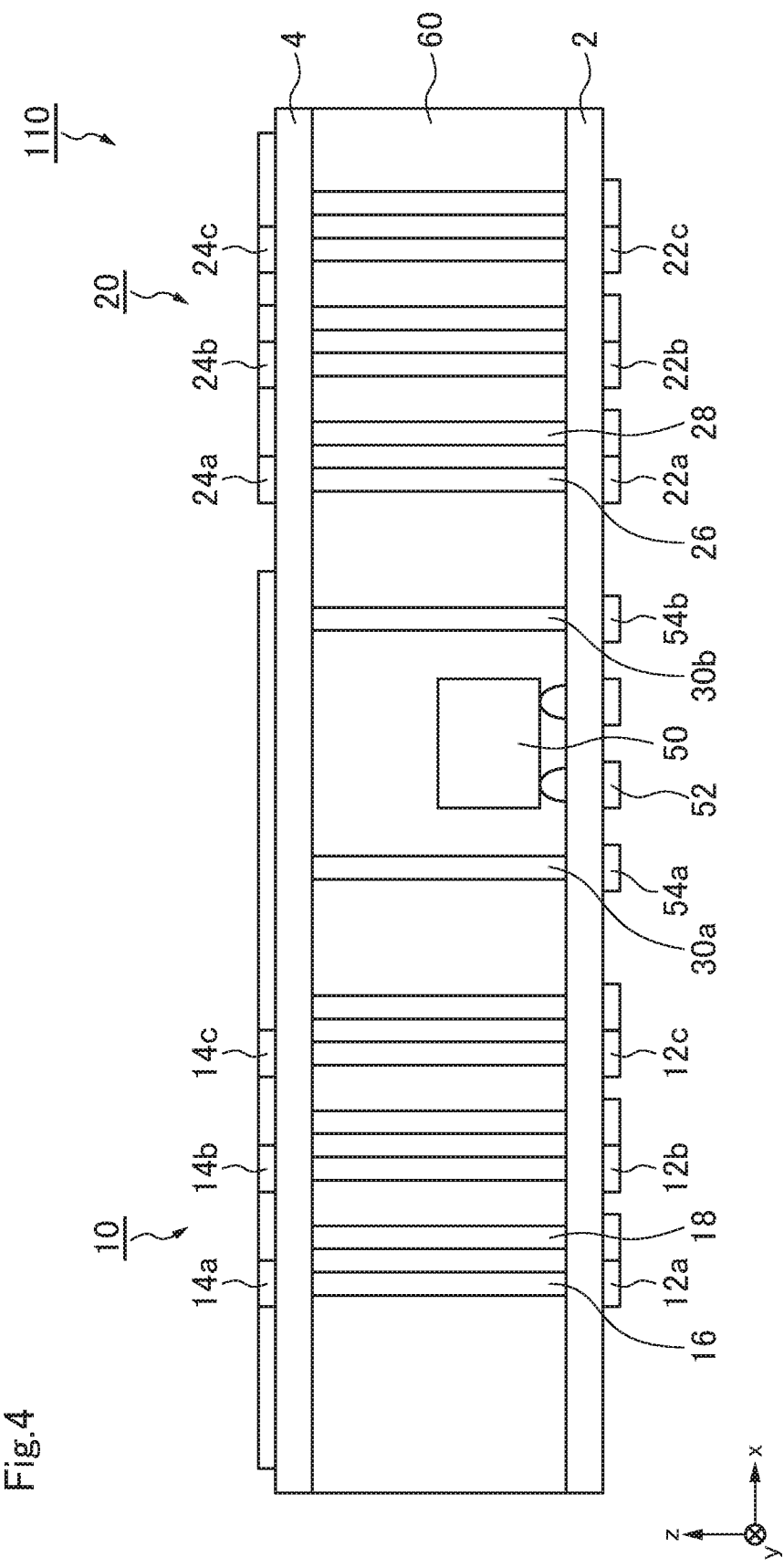

CURRENT DETECTION DEVICE

CROSS-REFERENCE TO RELATED APPLICATION

This application is based upon and claims the benefit of priority from Japanese Patent Application No. 2019-046679, filed on Mar. 14, 2019, the entire contents of which are incorporated herein by reference.

FIELD

Embodiments described herein relate generally to a current detection device.

BACKGROUND

A current detection device detects a magnetic field generated by a current flowing in a coil by using a magnetic measurement element such as a Hall element. For example, in the case of detecting the magnetic field by using the Hall element, the current detection device converts an intensity of the current flowing in the coil into a voltage.

In order to obtain a high magnetic field strength, two coils are disposed opposite to each other, and a magnetic measurement element is disposed between the two coils.

BRIEF DESCRIPTION OF THE DRAWINGS

FIG. 4 is a schematic side view of a current detection device according to a second embodiment;

DETAILED DESCRIPTION

Figure 1:
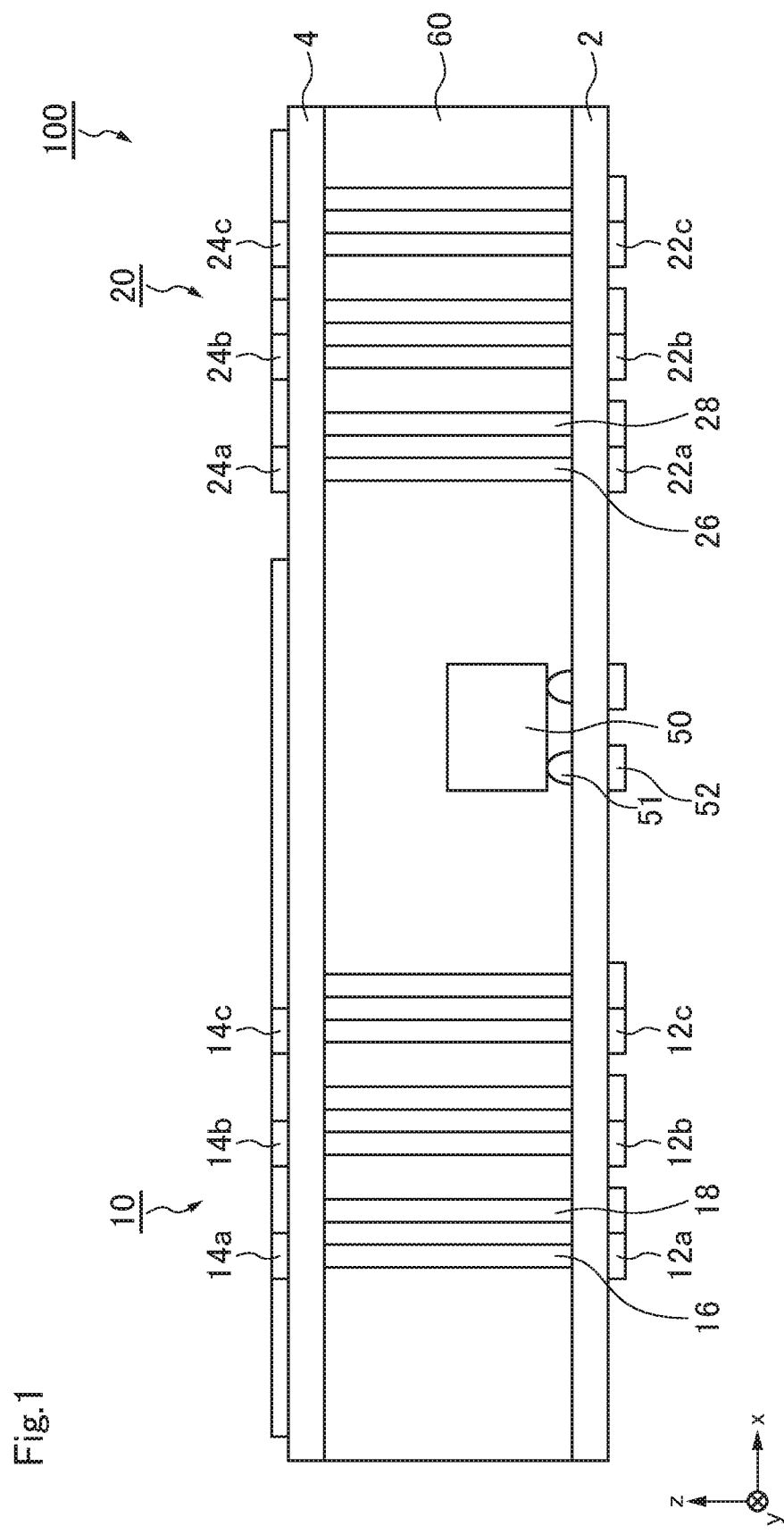
FIG. 1 is a schematic side view of a current detection device according to a first embodiment.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing as "lower". In the present specification, the terms "upper" and "lower" are not necessarily terms indicating the relationship with the direction of gravity.

First Embodiment

A current detection device according to the present embodiment includes: a first board; a second board provided above the first board in parallel to the first board; a magnetic measurement element provided between the first board and the second board; a first coil having at least one of a first wire provided on the first board or a second wire provided on the second board and having a first connection conductor connected to the first wire provided on the first board or the second wire provided on the second board; and a second coil having at least one of a third wire provided on the first board or a fourth wire provided on the second board and having a second connection conductor connected to the third wire provided on the first board or the fourth wire provided on the second board, the second coil being connected to the first coil such that magnetic fields generated in the first coil and the second coil by a current for electrically conducting the first coil and the second coil have the same direction.

FIG. 1 is a schematic side view of a current detection device 100 according to the present embodiment. Herein, in order to understand the structure, an interlayer insulating film 60 is illustrated as being transparent.

Figure 2:
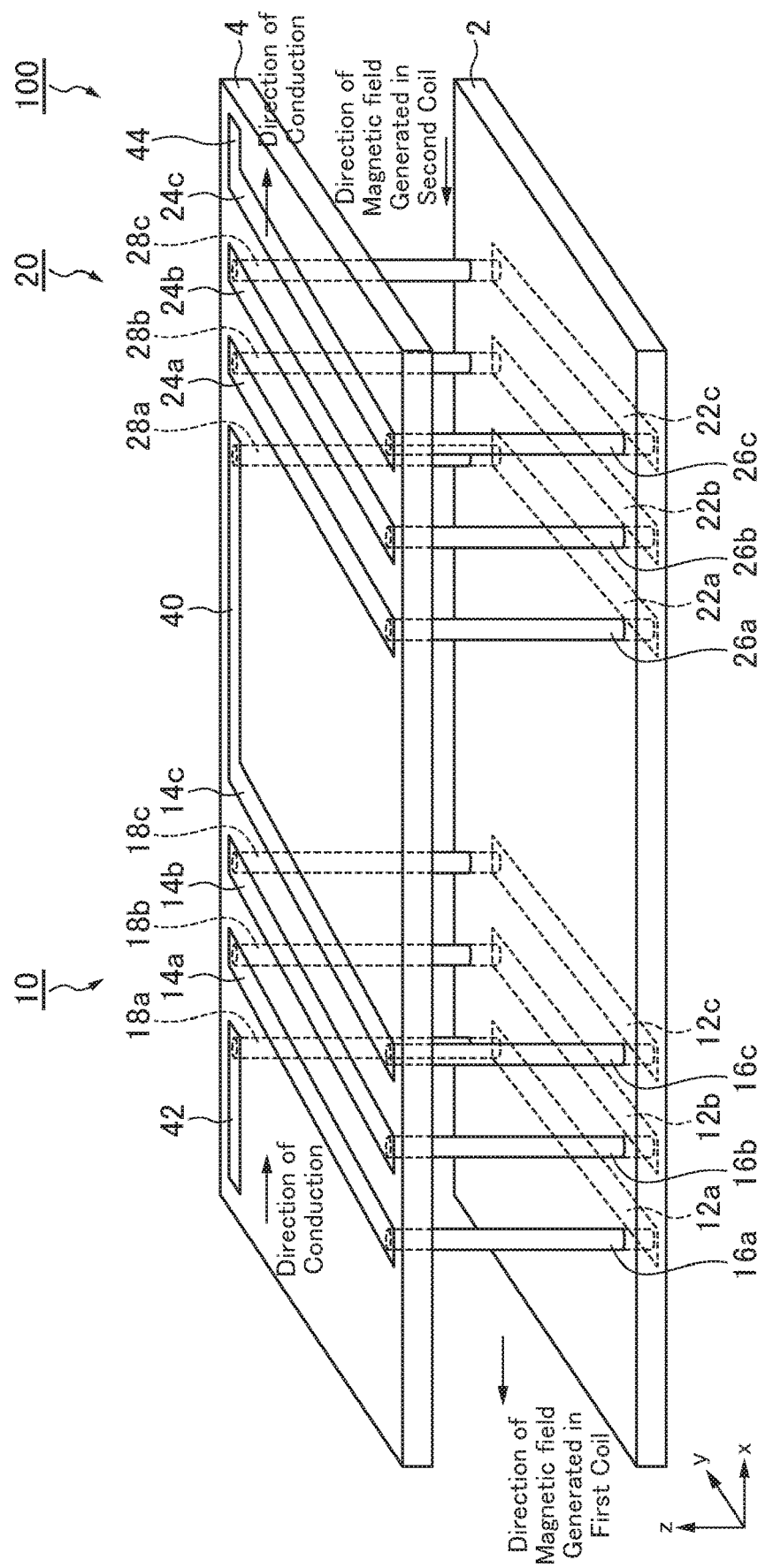
FIG. 2 is a schematic perspective view of the current detection device according to the first embodiment.

FIG. 2 is a schematic perspective view of the current detection device 100 according to the present embodiment. Herein, in order to understand the structure, a magnetic measurement element 50, a wire 52, and the interlayer insulating film 60 are omitted in illustration.

A first board 2 is a plate-shaped member that is formed by using, for example, an epoxy resin, a melamine derivative, a liquid crystal polymer, a polyphenylene ether (PPE) resin, a fluorocarbon resin, a phenol resin, a polyaminobismaleimide (PABM) resin, or the like. However, the material of the first board 2 is not limited to those described above. In addition, for example, the first board 2 is a single layer board, but the first board 2 is not limited to this.

A second board 4 is provided above the first board 2 in parallel to the first board 2. The second board 4 is a plate-shaped member that is formed by using, for example, an epoxy resin, a melamine derivative, a liquid crystal polymer, a polyphenylene ether (PPE) resin, a fluorine resin, a phenol resin, a polyaminobismaleimide (PABM) resin, or the like. However, the material of the second board 4 is not limited to those described above. In addition, for example, the second board 4 is a single phase board, but the second board 4 is not limited to this.

Herein, an x-axis, a y-axis perpendicular to the x-axis, and a z-axis perpendicular to the x-axis and the y-axis are defined. A front surface (board surface) of the first board 2 and a front surface (board surface) of the second board 4 are assumed to be disposed in parallel to the xy plane. The y direction is a direction perpendicular to the x direction.

The magnetic measurement element 50 is provided between the first board 2 and the second board 4. The magnetic measurement element 50 is, for example, a Hall element. The magnetic measurement element 50 is connected to the wire 52 by using a solder 51, measures a voltage generated in the Hall element through the wire 52, and measures a magnetic field strength from the measured voltage. The magnetic measurement element 50 is not limited to the hall element, but the magnetic measurement element 50 may be, for example, a magnetoresistance effect element such as a giant magnetoresistance effect element, an anisotropic magnetoresistance effect element, or a tunnel magnetoresistance effect element.

The first coil 10 is provided between the first board 2 and the second board 4. Herein, the first coil 10 includes a plurality of first wires 12 provided on the first board 2, a plurality of second wires 14 provided on the second board 4, first connection conductors 16 connecting the first wires 12 and the second wires 14, and second connection conductors 18 connecting the first wires 12 and the second wires 14.

In FIGS. 1 and 2, the first connection conductors 16 connect the first wires 12 and the second wires 14 on the front side of the drawing sheet. In addition, the second connection conductors 18 connect the first wires 12 and the second wires 14 on the back side of the drawing sheet.

The first wire 12 is a wire provided on, for example, the front surface of the first board 2. The first wire 12 contains a conductive material such as copper (Cu). In FIGS. 1 and 2, first wires 12a, 12b, and 12c are provided as the plurality of first wires 12. In addition, the number of first wires 12 may be one.

The second wire 14 is a wire provided on, for example, the front surface of the second board 4. The second wire 14 contains a conductive material such as copper (Cu). In FIG. 1 and FIG. 2, second wires 14a, 14b, and 14c are provided as the plurality of second wires 14. In addition, the number of second wires 14 may be one.

The first connection conductors 16 are conductors that connect the first wires 12 and the second wires 14. The first connection conductors 16 are, for example, vias, but the first connection conductors 16 may be patches or the like adhered to a side surface of the current detection device 100. At least of one of the first connection conductors 16 is preferably provided, for example, perpendicularly to the board surface of the first board 2 and the board surface of the second board 4 because it is easy to manufacture. The first connection conductor 16 contains a conductive material such as copper (Cu).

In FIG. 1 and FIG. 2, first connection conductors 16a, 16b, and 16c are provided as the first connection conductors 16. Then, the first connection conductor 16a connects the first wire 12a and the second wire 14a. The first connection conductor 16b connects the first wire 12b and the second wire 14b. The first connection conductor 16c connects the first wire 12c and the second wire 14c.

The second connection conductors 18 (an example of third connection conductors) are conductors that connect the first wires 12 and the second wires 14. The second connection conductor 18 are, for example, vias, but the second connection conductors 18 may be patches or the like adhered to the side surface of the current detection device 100. At least one of the second connection conductors 18 is preferably provided, for example, perpendicularly to the board surface of the first board 2 and the board surface of the second board 4 because it is easy to manufacture. The second connection conductor 18 contains a conductive material such as copper (Cu).

In FIGS. 1 and 2, second connection conductors 18a, 18b, and 18c are provided as the second connection conductors 18. Then, the second connection conductor 18a connects the first wire 12a and a second connection wire 42 described later. The second connection conductor 18b connects the first wire 12b and the second wire 14a. The second connection conductor 18c connects the first wire 12c and the second wire 14b.

The second coil 20 is provided between the first board 2 and the second board 4 so as to interpose the magnetic measurement element 50 between the first coil 10 and the second coil 20. In other words, the magnetic measurement element 50 is provided between the first coil 10 and the second coil 20. Herein, the second coil 20 includes a plurality of third wires 22 provided on the first board 2, a plurality of fourth wires 24 provided on the second board 4, third connection conductors 26 connecting the third wires 22 and the fourth wires 24, and fourth connection conductors 28 connecting the third wires 22 and the fourth wires 24.

In addition, in FIGS. 1 and 2, the third connection conductors 26 connect the third wires 22 and the fourth wires 24 on the front side of the drawing sheet. In addition, the fourth connection conductors 28 connect the third wire 22 and the fourth wire 24 on the back side of the drawing sheet.

The third wire 22 is a wire provided on, for example, the front surface of the first board 2. The third wire 22 contains a conductive material such as copper (Cu). In FIG. 1 and FIG. 2, third wires 22a, 22b, and 22c are provided as the plurality of third wires 22. In addition, the number of third wires 22 may be one.

The fourth wire 24 is a wire provided on, for example, the front surface of the second board 4. The fourth wire 24 contains a conductive material such as copper (Cu). In FIGS. 1 and 2, fourth wires 24a, 24b, and 24c are provided as the plurality of fourth wires 24. In addition, the number of fourth wires 24 may be one.

The third connection conductors 26 (an example of second connection conductors) are conductors that connect the third wires 22 and the fourth wires 24. The third connection conductors 26 are, for example, vias, but the third connection conductors may be patches or the like adhered to the side surface of the current detection device 100. At least one of the third connection conductors 26 is preferably provided, for example, perpendicularly to the board surface of the first board 2 and the board surface of the second board 4 because it is easy to manufacture. The third connection conductor 26 contains a conductive material such as copper (Cu).

In FIGS. 1 and 2, third connection conductors 26a, 26b, and 26c are provided as the third connection conductors 26. Then, the third connection conductor 26a connects the third wire 22a and the fourth wire 24a. The third connection conductor 26b connects the third wire 22b and the fourth wire 24b. The third connection conductor 26c connects the third wire 22c and the fourth wire 24c. In addition, the number of third connection conductors 26 may be one.

The fourth connection conductors 28 are conductors that connect the third wires 22 and the fourth wires 24. The fourth connection conductors 28 are, for example, vias, but the fourth connection conductors may be patches or the like adhered to the side surface of the current detection device 100. At least one of the fourth connection conductors 28 is preferably provided, for example, perpendicularly to the board surface of the first board 2 and the board surface of the second board 4 because it is easy to manufacture. The fourth connection conductor 28 contains a conductive material such as copper (Cu).

In FIGS. 1 and 2, fourth connection conductors 28a, 28b, and 28c are provided as the fourth connection conductors 28. Then, the fourth connection conductor 28a connects the third wire 22a and a first connection wire 40 described later. The fourth connection conductor 28b connects the third wire 22b and the fourth wire 24a. The fourth connection conductor 28c connects the third wire 22c and the fourth wire 24b. In addition, the number of fourth connection conductors 28 may be one.

The first connection wire 40 is a wire connecting the first coil 10 and the second coil 20. The first connection wire 40 contains a conductive material such as copper (Cu). In FIG. 1 and FIG. 2, the first connection wire 40 is provided on the second board 4 and connects the second wire 14c and the fourth connection conductor 28a. In addition, the disposition of the first connection wire 40 and the pattern of connection between the first coil 10 and the second coil 20 are not limited to this. For example, in a pattern, the first connection wire 40 may not be provided, and the first coil 10 and the second coil 20 may be directly connected.

The second connection wire 42 is a wire provided on, for example, the second board 4 and connected to the second connection conductor 18a. The second connection wire 42 contains a conductive material such as copper (Cu). The pattern of the second connection wire 42 is not limited to this, and the second connection wire 42 may not be provided.

The third connection wire 44 is a wire that is provided on, for example, the second board 4 and is connected to the fourth wire 24c. The third connection wire 44 contains a conductive material such as copper (Cu). In addition, the pattern of the third connection wire 44 is not limited to this, and the third connection wire 44 may not be provided.

The second connection wire 42 and the third connection wire 44 are provided so as to flow the current measured by the current detection device 100 to the first coil 10 and the second coil 20, respectively. When a current source (not illustrated) is connected to the second connection wire 42 and the third connection wire 44 and, thus, a current is flowed from the current source to the first coil 10 and the second coil 20, magnetic fields as illustrated in FIG. 2 are generated in the first coil 10 and the second coil 20. The strengths of the magnetic fields are measured by using the magnetic measurement element 50. Since the strength of the magnetic field is proportional to the current, it is possible to measure the current from the strengths of the magnetic fields.

The first coil 10 and the second coil 20 are connected such that the magnetic fields generated by a current (a current measured by the current detection device 100) for electrically conducting the first coil 10 and the second coil 20 have the same direction. Herein, "the same direction" denotes that the directions of the magnetic fields generated by the two coils do not have to completely match with each other. For example, in FIG. 2, the direction of the current electrically conducted to the second connection wire 42, the direction of the current electrically conducted to the third connection wire 44, the direction of the magnetic field generated in the first coil 10, and the direction of the magnetic field generated in the second coil 20 are illustrated. The direction of the current electrically conducted to the second connection wire 42 and the third connection wire 44 is from the left side to the right side in the drawing sheet. The direction of the magnetic field generated in the first coil and the direction of the magnetic field generated in the second coil are the same direction from the right side to the left side in the drawing sheet. In addition, the direction of the magnetic field generated in the first coil and the direction of the magnetic field generated in the second coil may not be completely the same direction. In addition, for example, the magnetic measurement element 50 can be disposed in the direction where the magnetic measurement element 50 can measure the magnetic field parallel to the front surface (board surface) of the first board 2 and the front surface (board surface) of the second board 4 so that the above-described magnetic field can be efficiently measured.

In addition, the expression "the first coil 10 or the second coil 20 is provided between the first board 2 and the second board 4" denotes that at least a portion of connection conductors or wires constituting the first coil 10 or the second coil 20 is provided between the first board 2 and the second board 4 and does not denote that all of the connection conductors and wires constituting the first coil 10 or the second coil 20 are provided between the first board 2 and the second board 4.

It is preferable that the first wire 12 and the third wire 22 are parallel to each other.

It is preferable that the second wire 14 and the fourth wire 24 are parallel to each other.

It is preferable that the plurality of first wires 12 are parallel to each other. It is preferable that the plurality of second wires 14 are parallel to each other. It is preferable that the plurality of third wires 22 are parallel to each other. It is preferable that the plurality of fourth wires 24 are parallel to each other.

In addition, it is preferable that each of the one ends of the plurality of second wires 14 is provided right above each of the one ends of the plurality of first wires 12, each of the other ends of the plurality of second wires 14 is provided right above each of the other ends of the plurality of first wires 12, each of the one ends of the plurality of fourth wires 24 is provided right above each of the one ends of the plurality of third wires 22, and each of the other ends of the plurality of fourth wires 24 is provided right above each of the other ends of the plurality of third wires 22. In addition, it is preferable that the plurality of first connection conductors 16 connect the one ends of the plurality of first wires 12 and the one ends of the plurality of second wires 14, the plurality of second connection conductors 18 connect the other ends of the plurality of first wires 12 and the other ends of the plurality of second wires 14, the plurality of third connection conductors 26 connect the one ends of the plurality of third wires 22 and the one ends of the plurality of fourth wires 24, and the plurality of fourth connection conductors 28 connect the other ends of the plurality of third wires 22 and the other ends of the plurality of fourth wires 24.

In FIG. 2, one end of the second wire 14a is provided right above one end of the first wire 12b. The other end of the second wire 14a is provided right above the other end of the first wire 12a. One end of the second wire 14b is provided right above one end of the first wire 12c. The other end of the second wire 14b is provided right above the other end of the first wire 12b. The other end of the second wire 14c is provided right above the other end of the first wire 12c. One end of the fourth wire 24a is provided right above one end of the third wire 22b. The other end of the fourth wire 24a is provided right above the other end of the third wire 22a. One end of the fourth wire 24b is provided right above one end of the third wire 22c. The other end of the fourth wire 24b is provided right above the other end of the third wire 22b. The other end of the fourth wire 24c is provided right above the other end of the third wire 22c.

In addition, in FIG. 2, the second connection conductor 18a is connected to the one end of the first wire 12a. The second connection conductor 18b connects the one end of the second wire 14a and the one end of the first wire 12b. The first connection conductor 16a connects the other end of the second wire 14a and the other end of the first wire 12a.

The second connection conductor 18c connects the one end of the second wire 14b and the one end of the first wire 12c. The first connection conductor 16b connects the other end of the second wire 14b and the other end of the first wire 12b. The first connection conductor 16c connects the other end of the second wire 14c and the other end of the first wire 12c. The fourth connection conductor 28a is connected to the one end of the third wire 22a. The fourth connection conductor 28b connects the one end of the fourth wire 24a and the one end of the third wire 22b. The third connection conductor 26a connects the other end of the fourth wire 24a and the other end of the third wire 22a. The fourth connection conductor 28c connects the one end of the fourth wire 24b and the one end of the third wire 22c. The third connection conductor 26b connects the other end of the fourth wire 24b and the other end of the third wire 22b. The third connection conductor 26c connects the other end of the fourth wire 24c and the other end of the third wire 22c.

The interlayer insulating film 60 is provided between the first board 2 and the second board 4 around the magnetic measurement element 50 and the connection conductor. As the interlayer insulating film 60, for example, an insulating film such as a known insulating resin or a known ceramic is preferably used. However, the material of the interlayer insulating film 60 is not limited to those described above.

Next, applications of the current detection device 100 according to the present embodiment will be described. The current detection device 100 according to the present embodiment is used for current detection. For example, a driving circuit (not illustrated) of the magnetic measurement element 50 and an amplifier (not illustrated) are provided around the current detection device 100. The driving circuit supplies, for example, an operating voltage of the magnetic measurement element 50 to operate the magnetic measurement element 50. In addition, the driving circuit supplies, for example, an operating voltage of the amplifier to operate the amplifier. For example, in a case where the magnetic measurement element 50 is a Hall element, a voltage generated by the magnetic field measured by the Hall element is measured after being amplified by the amplifier and is converted to a current. In this manner, the current can be measured by the current detection device 100. The current detection device 100 according to the present embodiment is used for an AC/DC adapter, a control device for a general-purpose inverter or a variable motor speed device, overcurrent protection of a power module, and the like.

Next, the functions and effects of the current detection device 100 according to the present embodiment will be described.

Figure 3A:
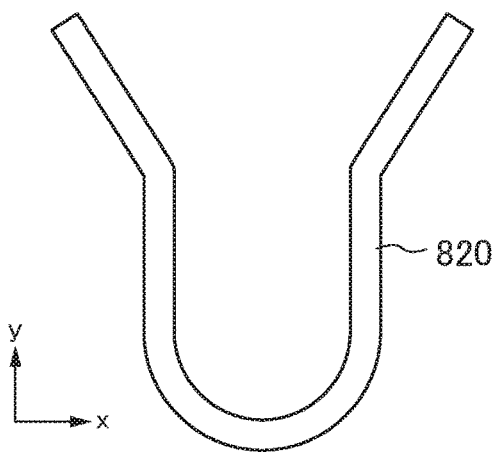
FIGS. 3A to 3C are schematic views of a current detection device according to Comparative Example of the first embodiment.
Figure 3B:
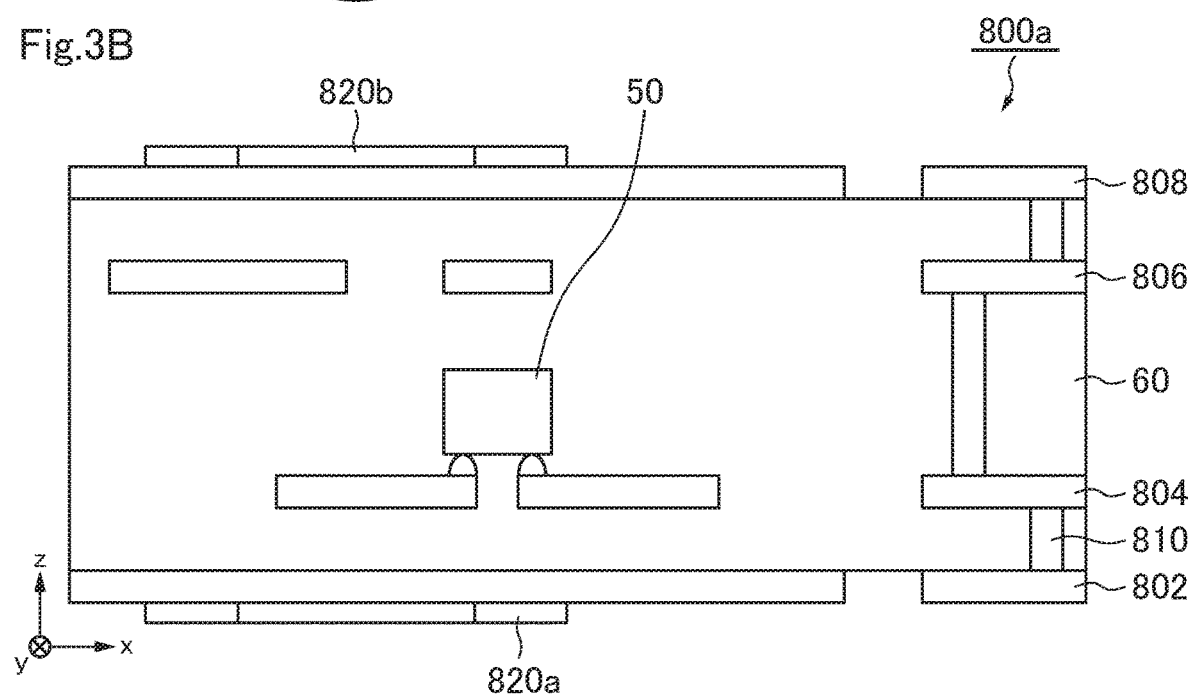
Figure 3C:
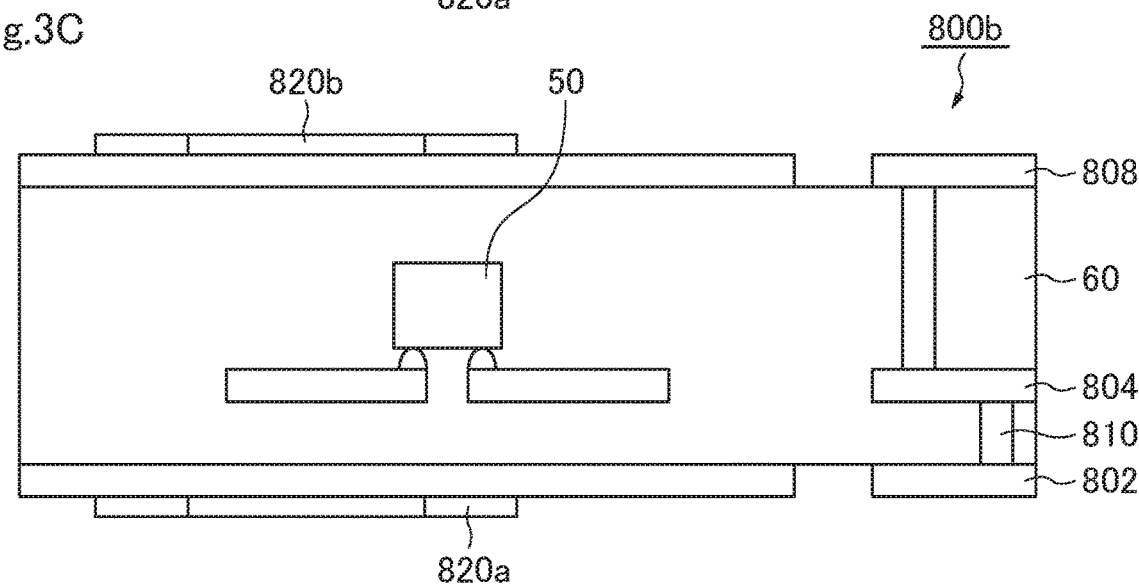

FIGS. 3A to 3C are schematic views of a current detection device according to Comparative Example of the present embodiment. FIG. 3A illustrates a top view of a coil 820 used in Comparative Example. The coil 820 is a one-turn coil having a planar shape. FIG. 3B is a schematic side view of a current detection device 800a according to Comparative Example using the coil 820 illustrated in FIG. 3A. In addition, in order to understand the structure, the interlayer insulating film 60 is illustrated as being transparent. A coil 820a as the coil 820 is provided on the front surface of a first board 802. In addition, a coil 820b as the coil 820 is provided on the front surface of a fourth board 808. The magnetic measurement element 50 is provided on a second board 804. The first board 802, the second board 804, a third board 806, and the fourth board 808 are sequentially stacked, and electrical connection between the respective boards is made by the connection conductor 810. When a current to be measured flows in the coil 820a and the coil 820b, a magnetic field is generated in the vertical direction of the drawing sheet. The current is measured by measuring the magnetic field by using the magnetic measurement element 50.

However, the magnetic field generated by the coil 820 is generated in the vertical direction of the drawing sheet. For this reason, it is required to prepare the second board 804 having a wire connected to the magnetic measurement element, mount the magnetic measurement element 50 on the second board 804, and provide the magnetic measurement element 50 between the coil 820a and the coil 820b. Then, the number of layers of the board increases, and thus, so that there is a problem in that that it is difficult to reduce the size and the current detection device becomes expensive.

FIG. 3C illustrates a schematic side view of a current detection device 800b according to Comparative Example. The current detection device 800b is obtained by removing the third board 806 of the current detection device 800a. In this case, the current detection device 800a has a four-layer structure using four boards, whereas the current detection device 800b has a three-layer structure using three boards, so that it is possible to further reduce the size. However, also in the current detection device 800b, since the second board 804 on which the magnetic measurement element 50 is mounted is provided, there is a problem in that it is difficult to reduce the size and the current detection device becomes expensive.

The current detection device 100 according to the present embodiment includes a first wire 12 provided on the first board 2, a second wire 14 provided on the second board 4, and a first connection conductor 16 and a second connection conductor 18 connecting the first wire and the second wire. In addition, the current detection device 100 includes a third wire 22 provided on the first board 2, a fourth wire 24 provided on the second board 4, and a third connection conductor 26 and a fourth connection conductor 28 connecting the third wire and the fourth wire.

Therefore, a coil which generates a magnetic field can be formed by using two boards. Therefore, the number of boards constituting the current detection device 100 can be reduced, so that the current detection device can be miniaturized and the cost can be reduced. In addition, for example, the number of turns of the coil can be easily increased by increasing the number of the first wires 12, the number of the second wires 14, the number of the first connection conductors 16, and the number of the second connection conductors 18, so that the magnetic field strength generated by the current also increases.

It is preferable that one end or the other end of the second wire 14 is provided right above one end or the other end of the first wire 12, one end or the other end of the fourth wire 24 is provided right above one end or the other end of the third wire 22, and the end portions (one end or the other end) are connected by the connection conductors. This is because, if the end portions are not connected by the connection conductors, the end portions become stubs and reflection or the like of the current may occur.

It is preferable that the first wire 12 and the second wire 14 are parallel to each other, and the third wire 22 and the fourth wire 24 are parallel to each other. Herein, the magnetic flux density B measured by the magnetic measurement element 50 is calculated by $B=\Phi/S$. $\Phi$ is the total magnetic flux generated by the coil, and S is the area of the magnetosensitive portion of the magnetic measurement element 50. In addition, in general, there is a relationship $\Phi=L_I \times I$. Herein, $L_I$ is the self-inductance of the coil, and I is the current flowing in the coil. Furthermore, in the case of having two coils, the combined inductance L has a relationship of $L=L_A+L_B+2M$. Herein, $L_A$ is the self inductance of the first coil 10, $L_B$ is the self inductance of the second coil, and 2M is the mutual inductance between the first coil 10 and the second coil 20.

In a case where the first wire 12 and the second wire 14 are parallel to each other and the third wire 22 and the fourth wire 24 are parallel to each other, the first coil 10 and the second coil 20 can be easily brought close to each other. If the first coil 10 and the second coil 20 can be brought close to each other, the above-described mutual inductance increases, so that the total magnetic flux Φ generated by the coils increases. Therefore, the magnetic flux density B measured by the magnetic measurement element 50 increases, and thus, it is possible to provide a more sensitive current detection device 100.

It is preferable that the plurality of first wires 12 are parallel to each other, the plurality of second wires 14 are parallel to each other, the plurality of third wires 22 are parallel to each other, and the plurality of fourth wires 24 are parallel to each other. This is because, due to the parallel wires, it is possible to increase the number of turns of a coil in a smaller space.

According to the current detection device according to the present embodiment, it is possible to provide a miniaturized current detection device.

Second Embodiment

A current detection device according to the present embodiment is different from the current detection device according to the first embodiment in that the current detection device further includes a fifth connection conductor provided between the first coil and the second coil. Herein, the same points as those of the first embodiment are omitted in description.

FIG. 4 is a schematic side view of a current detection device 110 according to the present embodiment. A fifth connection conductor 30a is provided between the first coil 10 and the magnetic measurement element 50. The fifth connection conductor 30a is, for example, a shield via being provided perpendicularly to the first board 2 or the second board 4 and penetrating the interlayer insulating film 60 and contains a conductive material such as copper (Cu). In addition, a fifth connection conductor 30b is provided between the second coil 20 and the magnetic measurement element 50. The fifth connection conductor 30b is, for example, a shield via being provided perpendicularly to the first board 2 or the second board 4 and penetrating the interlayer insulating film 60, and contains a conductive material such as copper (Cu). The fifth connection conductors 30a and 30b are connected to the ground G through wires 54a and 54b to be grounded. The fifth connection conductors 30a and 30b are used to remove noise in the current detection device 110. For example, by providing a plurality of fifth connection conductors 30a and 30b in alignment with the x direction, the y direction, or the like, it is possible to remove larger noise.

Figure 5:
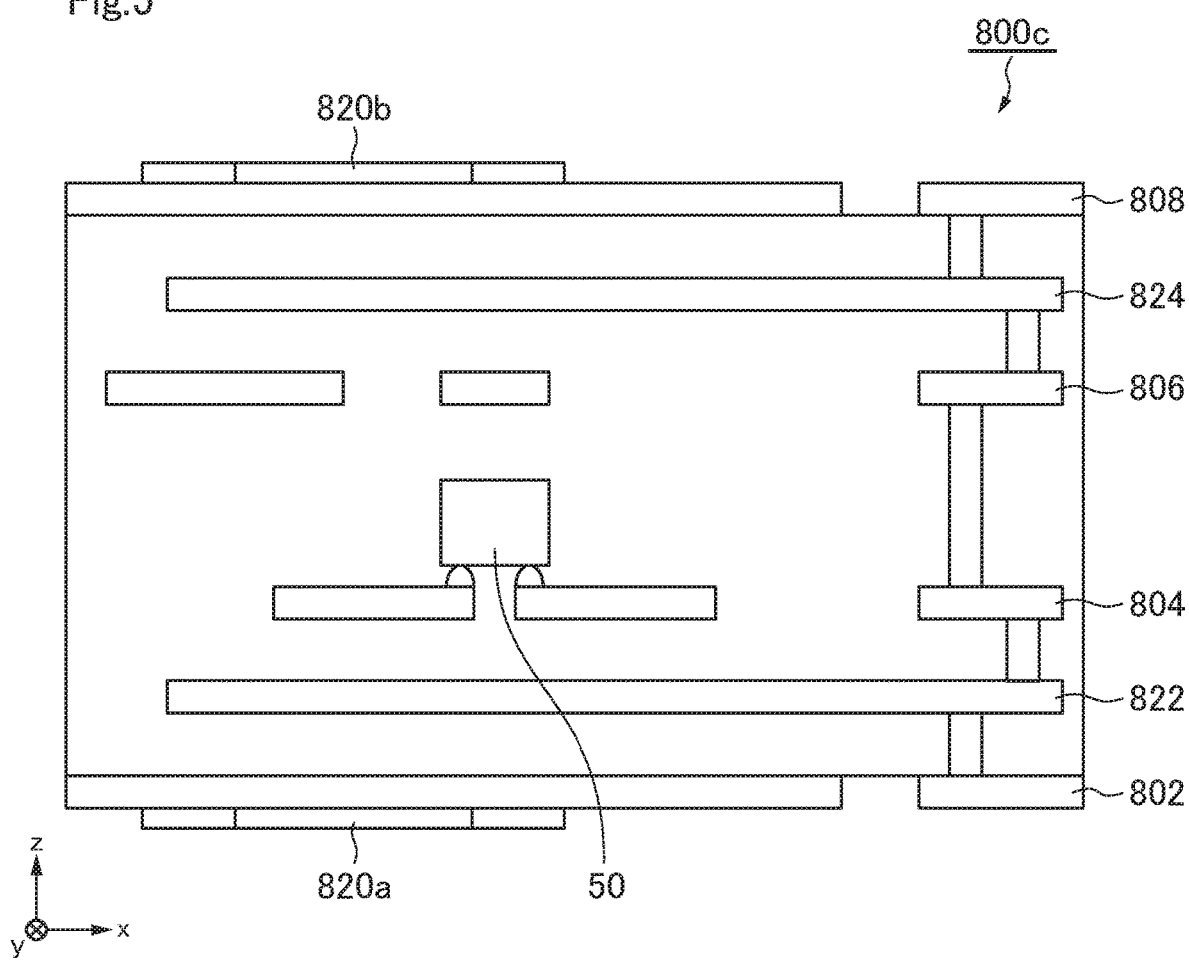
FIG. 5 is a schematic side view of a current detection device according to Comparative Example of the second embodiment.

FIG. 5 is a schematic side view of a current detection device 800c according to Comparative Example of the current detection device 110 according to the present embodiment. A first shield 822 having a planar shape is provided between the first board 802 and the magnetic measurement element 50. In addition, a second shield 824 having a planar shape is provided between the fourth board 808 and the magnetic measurement element 50. In the current detection device 800c according to Comparative Example, since the planar shields are provided, the number of layers increases, and thus, there is a problem in that it is difficult to miniaturize the current detection device having the shield.

According to the current detection device 110 according to the present embodiment, the fifth connection conductor 30 is provided between the first coil 10 and the magnetic measurement element 50 or between the second coil 20 and the magnetic measurement element 50, and thus, the current detection device is used for removing noise. Therefore, noise can be removed without changing the number of layers.

According to the current detection device according to the present embodiment, it is possible to provide a miniaturized current detection device.

Third Embodiment

A current detection device according to the present embodiment is different from the current detection devices according to the first and second embodiments in that at least one of the first connection conductors 16 and at least one of the second connection conductors 18 or at least one of the third connection conductors 26 and at least one of the fourth connection conductors 28 are provided on the front surface (side surface) of the current detection device. Herein, the same points as those of the first and second embodiments are omitted in description.

Figure 6:
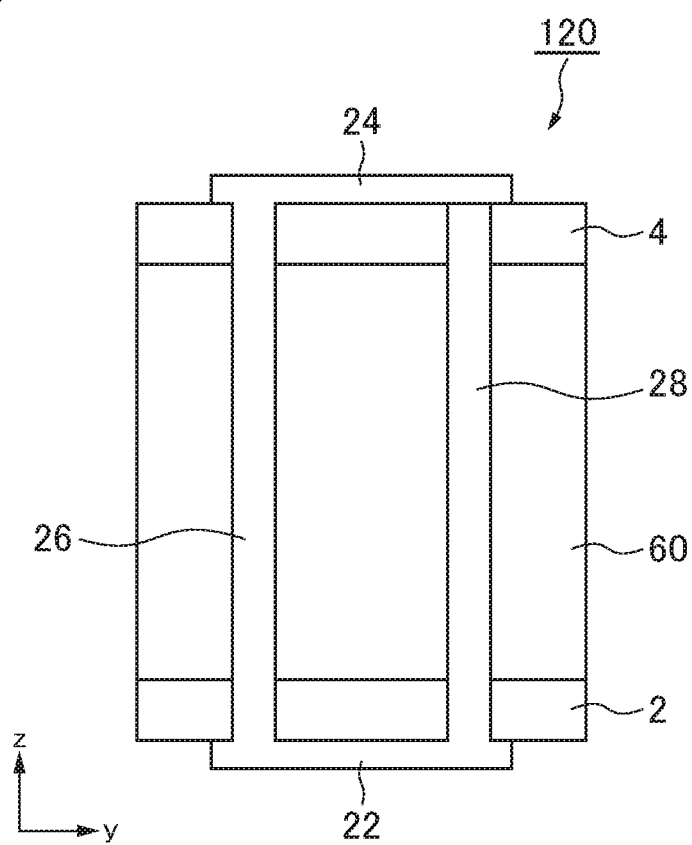
FIG. 6 is a schematic side view of a current detection device according to a third embodiment.

FIG. 6 is a schematic side view of a current detection device 120 according to the present embodiment.

In FIG. 6, the side surface parallel to the yz plane of the current detection device 120 is illustrated. The third connection conductor 26 is connected to the third wire 22 and the fourth wire 24, and the fourth connection conductor 28 is connected to the third wire 22. The third connection conductor 26 and the fourth connection conductor 28 are patches made of, for example, Cu, and are formed by bonding the patches to the side surface of the current detection device 120. In addition, for example, the fourth connection conductor 28 may be connected to the third wire 22 and the fourth wire 24, and the third connection conductor 26 may be connected to the third wire 22. Thus, the pattern of connection is not limited to this. In addition, since the first connection conductor 16 and the second connection conductor 18 are formed to have same configurations, the description is described.

Since patches generally have a larger cross-sectional area than vias, it is possible to reduce the resistance. For this reason, it is possible to reduce the heat generated as the Joule heat.

According to the current detection device according to the present embodiment, it is possible to provide a miniaturized current detection device.

Fourth Embodiment

A current detection device according to the present embodiment is different from the current detection devices according to the first to third embodiments in that a magnetic measurement element 50 is provided on a second board 4. Herein, the same points as those of the first to third embodiments are omitted in description.

Figure 7:
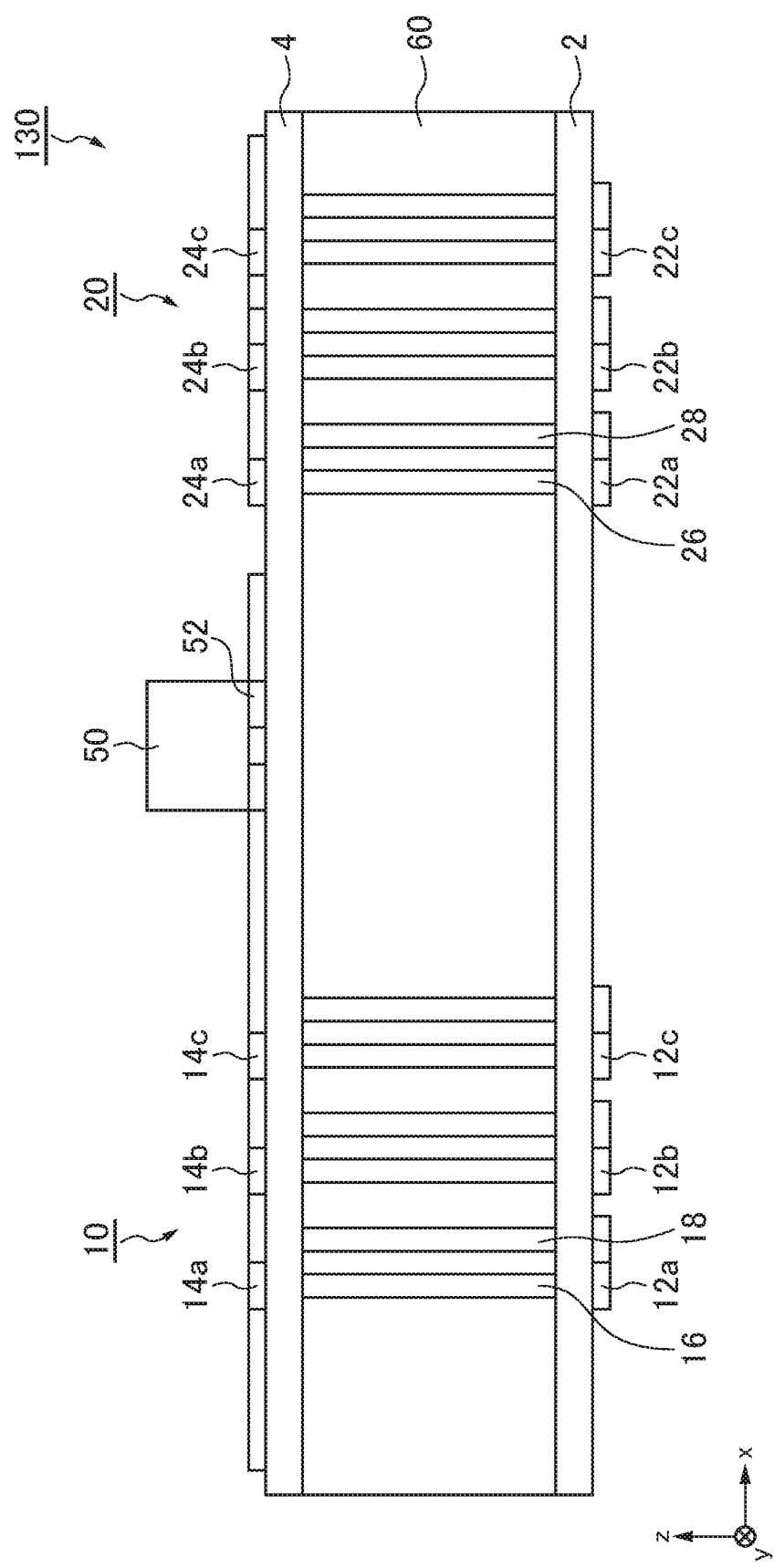
FIG. 7 is a schematic side view of a current detection device according to a fourth embodiment.

FIG. 7 is a schematic side view of a current detection device 130 according to the present embodiment. In the current detection device 130, the magnetic measurement element 50 is provided (mounted) on the front surface of the second board 4. In other words, the magnetic measurement element 50 is provided on the second board 4 between the first coil 10 and the second coil 20. For this reason, as compared with the case where the magnetic measurement element 50 is provided between the first board 2 and the second board 4 and sealed with the interlayer insulating film 60, in a case where the magnetic measurement element 50 is mounted on the front surface of the second board 4, for example, by solder, since the reliability of the connection by the solder is improved, it is possible to easily manufacture the current detection device.

According to the current detection device according to the present embodiment, it is possible to provide a miniaturized current detection device.

Fifth Embodiment

A current detection device according to the present embodiment is different from the current detection devices according to the first to fourth embodiments in that a plurality of magnetic measurement elements 50 are provided. Herein, the same points as those of the first to fourth embodiments are omitted in description.

Figure 8:
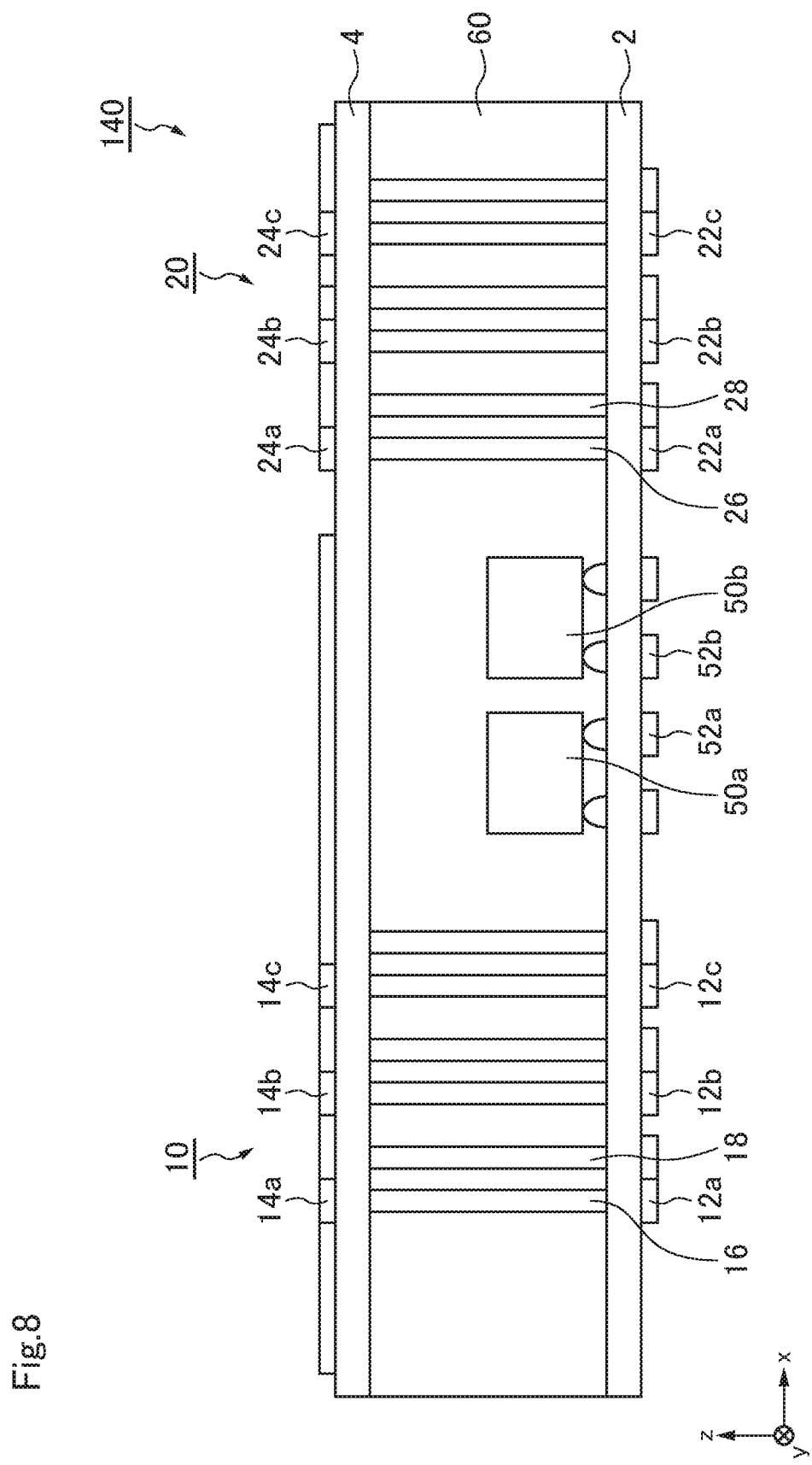
FIG. 8 is a schematic side view of a current detection device according to a fifth embodiment.

FIG. 8 is a schematic side view of the current detection device 140 according to the present embodiment. Two magnetic measurement elements 50a and 50b are provided. In addition, the number of the magnetic measurement elements 50 is not limited to this.

By providing more magnetic measurement elements 50, the overall magnitude of the magnetic flux measured by the magnetic measurement elements 50 is increased even if the strength of the magnetic field is the same. Therefore, a more sensitive current detection device is provided.

According to the current detection device according to the present embodiment, it is possible to provide a miniaturized current detection device.

Sixth Embodiment

A current detection device according to the present embodiment is different from the current detection devices of the first to fifth embodiments in that the current detection device further includes third and fourth coils provided so as to interpose the magnetic measurement element in the y direction. Herein, the same points as those of the first to fifth embodiments are omitted in description.

Figure 9:
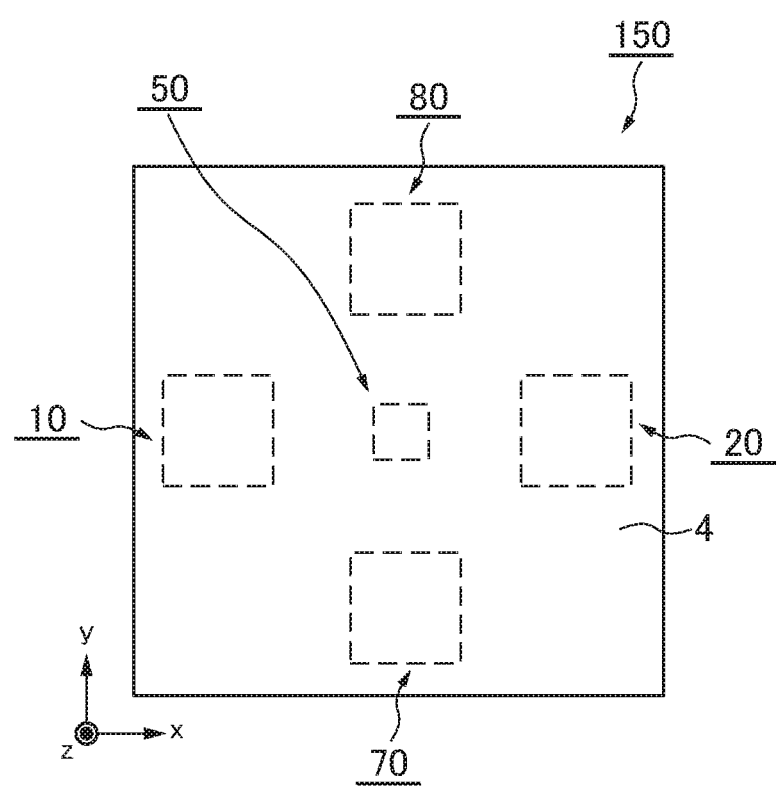
FIG. 9 is a schematic top view illustrating a positional relationship between a first coil, a second coil, a third coil, a fourth coil, and a magnetic measurement element in a current detection device according to a sixth embodiment.

FIG. 9 is a schematic top view illustrating a positional relationship between a first coil 10, a second coil 20, a third coil 70, a fourth coil 80, and a magnetic measurement element 50 in a current detection device 150 according to the present embodiment. The third coil 70 and the fourth coil 80 are provided to interpose the magnetic measurement element 50 in the y direction. In other words, the magnetic measurement element 50 is provided between the third coil 70 and the fourth coil 80. Herein, the magnetic measurement element 50 can measure the magnetic fluxes in the x direction and the magnetic flux in the y direction. In addition, both a magnetic measurement element capable of measuring the magnetic flux in the x direction and a magnetic measurement element capable of measuring the magnetic flux in the y direction may be provided.

Figure 10:
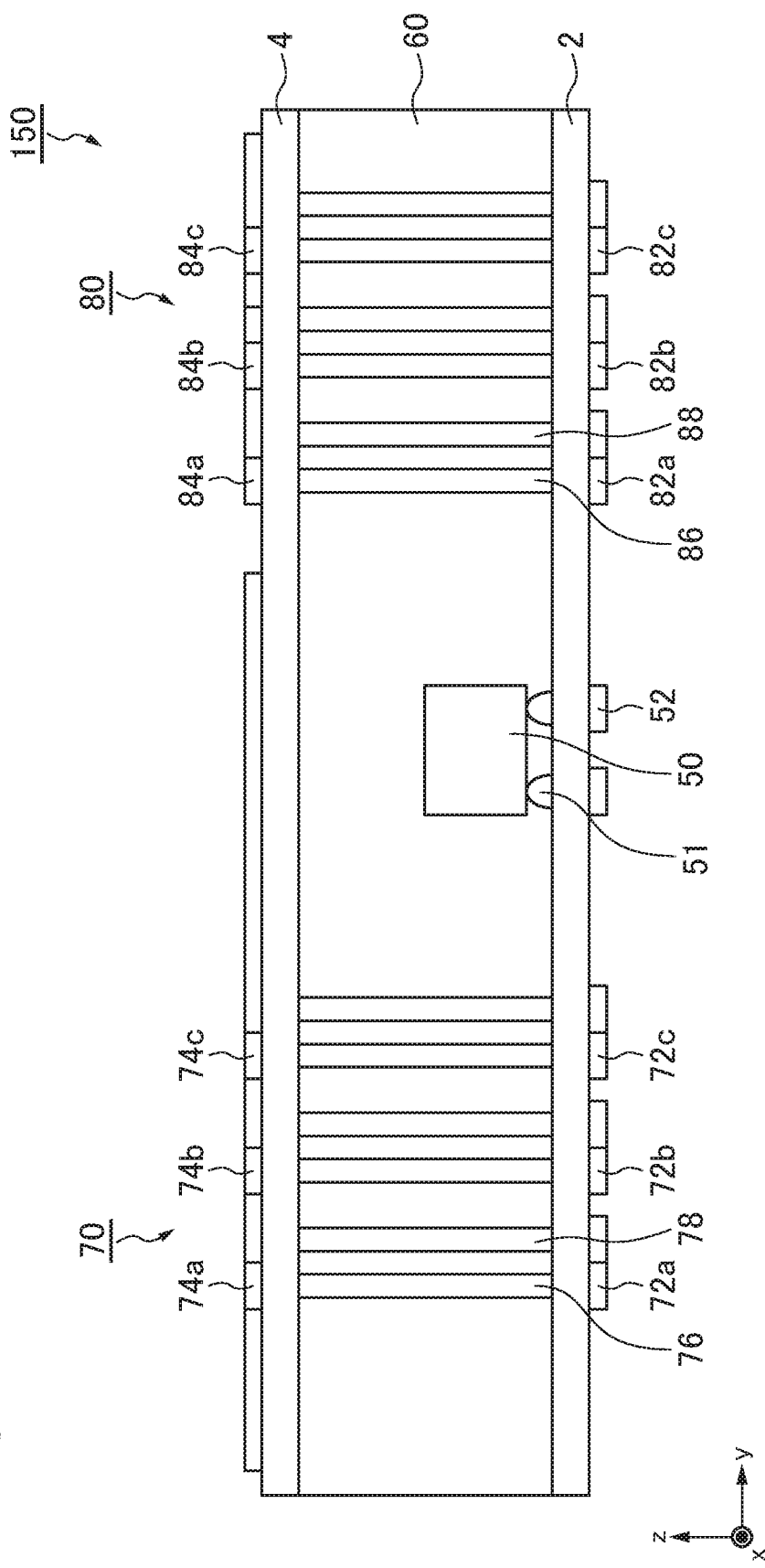
FIG. 10 is a schematic side view illustrating the third coil, the magnetic measurement element, and the fourth coil in the current detection device according to the sixth embodiment.

FIG. 10 is a schematic side view illustrating the third coil 70, the magnetic measurement element 50, and the fourth coil when viewed from the x direction in the current detection device according to the present embodiment. Herein, the first coil 10 and the second coil 20 are omitted in illustration.

The third coil 70 includes a plurality of fifth wires 72 provided on the first board 2, a plurality of sixth wires 74 provided on the second board 4, sixth connection conductors 76 connecting the fifth wires 72 and the sixth wires 74, and seventh connection conductors 78 connecting the fifth wires 72 and the sixth wires 74. In addition, the sixth connection conductors 76 connect the fifth wires 72 and the sixth wires 74 on the front side of the drawing sheet. In addition, the seventh connection conductors 78 connect the fifth wires 72 and the sixth wires 74 on the back side of the drawing sheet.

The fourth coil 80 includes a plurality of seventh wires 82 provided on the first board 2, a plurality of eighth wires 84 provided on the second board 4, eighth connection conductors 86 connecting the seventh wires 82 and the eighth wires 84 and ninth connection conductors 88 connecting the seventh wires 82 and the eighth wires 84. In addition, the eighth connection conductors 86 connect the seventh wires 82 and the eighth wires 84 on the front side of the drawing sheet. In addition, the ninth connection conductors 88 connect the seventh wires 82 and the eighth wires 84 on the back side of the drawing sheet.

The third coil 70 and the fourth coil 80 are connected such that the magnetic fields generated by a current for electrically conducting the third coil 70 and the fourth coil 80 have the same direction (magnetic field in the y direction). With respect to the pattern of connection, the connection can be made, for example, in the same manner as the connection of the first coil 10 and the second coil 20 illustrated in FIG. 2. In addition, all of the first coil 10, the second coil 20, the third coil 70, and the fourth coil 80 may be connected, and the same current may be electrically conducted.

Furthermore, in FIG. 9, coils are provided for example, between the first coil 10 and the third coil 70 and between the second coil 20 and the fourth coil 80, respectively, so that magnetic fields may be generated in the directions deviated by 45 degrees from the x direction and y direction. In this case, a magnetic measurement element capable of detecting the magnetic field generated in the direction deviated by 45 degrees from the x direction and the y direction may be further provided. In addition, coils may be provided, for example, between the first coil 10 and the fourth coil 80 and between the second coil 20 and the third coil 70, respectively.

In addition, the third coil 70 and the fourth coil 80 are disposed in directions intersecting with the x direction, deviated by a predetermined angle from the x direction and the y direction, so that magnetic fields may be generated in directions intersecting with the x direction. Herein, the x direction is an example of the first direction, and the direction intersecting the x direction or the y direction is an example of the second direction.

In other words, the current detection device according to the present embodiment includes: a first board 2; a second board 4 provided above the first board 2 in parallel to the first board 2; a magnetic measurement element 50 provided between the first board 2 and the second board 4; a first coil 10 having at least one of a first wire 12 provided on the first board 2 or a second wire 14 provided on the second board 4 and having a first connection conductor 16 connected to the first wire 12 provided on the first board 2 or the second wire 14 provided on the second board 4; a second coil 20 having at least one of a third wire 22 provided on the first board 2 or a fourth wire 24 provided on the second board 4 and having a third connection conductor 26 (an example of a second connection conductor) connected to the third wire 22 provided on the first board 2 or the fourth wire 24 provided on the second board 4, the second coil 20 being connected to the first coil 10 such that magnetic fields generated in the first coil 10 and the second coil 20 by a current for electrically conducting the first coil 10 and the second coil 20 have the same direction, the second coil 20 being provided so as to interpose a magnetic measurement element between the first coil 10 and the second coil 20 in a first direction parallel to a board surface of the first board 2; a third coil 70 having at least one of a fifth wire 72 provided on the first board 2 or a sixth wire 74 provided on the second board 4 and having a sixth connection conductor 76 (an example of a third connection conductor) connected to the fifth wire 72 provided on the first board 2 or the sixth wire 74 provided on the second board 4; and a fourth coil 80 having at least one of a seventh wire 82 provided on the first board 2 or an eighth wire 84 provided on the second board 4 and having an eighth connection conductor 86 (an example of a fourth connection conductor) connected to the seventh wire 82 provided on the first board 2 or the eighth wire 84 provided on the second board 4, the fourth coil 80 being connected to the third coil 70 such that magnetic fields generated in the third coil 70 and the fourth coil 80 by a current for electrically conducting the third coil 70 and the fourth coil 80 have the same direction, the fourth coil 80 being provided so as to interpose a magnetic measurement element between the third coil 70 and the fourth coil 80 in a second direction perpendicular to the first direction parallel to the board surface of the first board 2.

The third coil 70 includes: a plurality of fifth wires 72 provided on the first board 2; a plurality of sixth wires 74 provided on the second board 4; a plurality of sixth connection conductors 76 (an example of a third connection conductor) connecting the plurality of fifth wires 72 and the plurality of sixth wires 74; and a plurality of seventh connection conductors 78 connecting the plurality of fifth wires 72 and the plurality of sixth wires 74. The fourth coil 80 includes: a plurality of seventh wires 82 provided on the first board 2; a plurality of eighth wires 84 provided on the second board 4; a plurality of eighth connection conductors 86 (an example of a fourth connection conductor) connecting the plurality of seventh wires 82 and the plurality of eighth wires 84; and a plurality of ninth connection conductors 88 (an example of an eighth connection conductor) connecting the plurality of seventh wires 82 and the plurality of eighth wires 84.

The fifth wire 72 and the seventh wire 82 are parallel to each other, and the sixth wire 74 and the eighth wire 84 are parallel to each other.

The plurality of fifth wires 72 are parallel to each other, the plurality of sixth wires 74 are parallel to each other, the plurality of seventh wires 82 are parallel to each other, and the plurality of eighth wires 84 are parallel to each other.

According to the current detection device according to the present embodiment, since the magnetic fluxes in the x direction and y direction can be detected, it is possible to provide a more sensitive and miniaturized current detection device.

While certain embodiments have been described, these embodiments have been presented by way of example only, and are not intended to limit the scope of the inventions. Indeed, current detection devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A current detection device comprising:
a first board;
a second board provided above the first board in parallel to the first board;
a magnetic measurement element provided between the first board and the second board;
a first coil having at least one of a first wire provided on the first board or a second wire provided on the second board and having a first connection conductor connected to the first wire provided on the first board or the second wire provided on the second board; and
a second coil having at least one of a third wire provided on the first board or a fourth wire provided on the second board and having a second connection conductor connected to the third wire provided on the first board or the fourth wire provided on the second board, the second coil being connected to the first coil such that magnetic fields generated in the first coil and the second coil by a current for electrically conducting the first coil and the second coil have the same direction.

2. The current detection device according to claim 1, wherein the first coil includes:
a plurality of the first wires provided on the first board;
a plurality of the second wires provided on the second board;
a plurality of the first connection conductors connecting the first wires and the second wires; and
a plurality of third connection conductors connecting the first wires and the second wires, and
wherein the second coil includes:
a plurality of the third wires provided on the first board;
a plurality of the fourth wires provided on the second board;
a plurality of the second connection conductors connecting the third wires and the fourth wires; and
a plurality of fourth connection conductors connecting the third wires and the fourth wires.

3. The current detection device according to claim 2, wherein each of the one ends of the second wires is provided right above each of the one ends of the first wires,
wherein each of the other ends of the second wires is provided right above each of the other ends of the first wires,
wherein each of the one ends of the fourth wires is provided right above each of the one ends of the third wires,
wherein each of the other ends of the fourth wires is provided right above each of the other ends of the third wires,
wherein the first connection conductors connect the one ends of the first wires and the one ends of the second wires,
wherein the third connection conductors connect the other ends of the first wires and the other ends of the second wires,
wherein the second connection conductors connect the one ends of the third wires and the one ends of the fourth wires, and
wherein the fourth connection conductors connect the other ends of the third wires and the other ends of the fourth wires.

4. The current detection device according to claim 2, wherein the first wire and the third wire are parallel to each other, and wherein the second wire and the fourth wire are parallel to each other.

5. The current detection device according to claim 2, wherein the first wires are parallel to each other, wherein the second wires are parallel to each other, wherein the third wires are parallel to each other, and wherein the fourth wires are parallel to each other.

6. The current detection device according to claim 1, further comprising a fifth connection conductor provided between the first coil and the second coil to be perpendicular to the first board.

7. The current detection device according to claim 1, further comprising a plurality of the magnetic measurement elements.

8. The current detection device according to claim 2, wherein at least one of the first connection conductors and at least one of the second connection conductors or at least one of the third connection conductors and at least one of the fourth connection conductors are provided on a front surface of the current detection device.

9. The current detection device according to claim 1, further comprising an interlayer insulating film provided between the first board and the second board.

10. The current detection device according to claim 1, wherein at least one of the first connection conductors, at least one of the second connection conductors, at least one of the third connection conductors, or at least one of the fourth connection conductors is provided perpendicularly to the first board and the second board.

11. The current detection device according to claim 1, wherein the magnetic measurement element is provided between the first coil and the second coil.

12. A current detection device comprising:
a first board;
a second board provided above the first board in parallel to the first board;
a magnetic measurement element provided between the first board and the second board;
a first coil having at least one of a first wire provided on the first board or a second wire provided on the second board and having a first connection conductor connected to the first wire provided on the first board or the second wire provided on the second board;
a second coil having at least one of a third wire provided on the first board or a fourth wire provided on the second board and having a second connection conductor connected to the third wire provided on the first board or the fourth wire provided on the second board, the second coil being connected to the first coil such that magnetic fields generated in the first coil and the second coil by a current for electrically conducting the first coil and the second coil have the same direction;
a third coil having at least one of a fifth wire provided on the first board or a sixth wire provided on the second board and having a third connection conductor connected to the fifth wire provided on the first board or the sixth wire provided on the second board; and
a fourth coil having at least one of a seventh wire provided on the first board or an eighth wire provided on the second board and having a fourth connection conductor connected to the seventh wire provided on the first board or the eighth wire provided on the second board, the fourth coil being connected to the third coil such that magnetic fields generated in the third coil and the fourth coil by a current for electrically conducting the third coil and the fourth coil have the same direction.

13. The current detection device according to claim 12, wherein the first coil includes:
a plurality of the first wires provided on the first board;
a plurality of the second wires provided on the second board;
a plurality of the first connection conductors connecting the first wires and the second wires; and
a plurality of fifth connection conductors connecting the first wires and the second wires,
wherein the second coil includes:
a plurality of the third wires provided on the first board;
a plurality of the fourth wires provided on the second board;
a plurality of the second connection conductors connecting the third wires and the fourth wires; and
a plurality of sixth connection conductors connecting the third wires and the fourth wires,
wherein the third coil includes:
a plurality of the fifth wires provided on the first board;
a plurality of the sixth wires provided on the second board;
a plurality of the third connection conductors connecting the fifth wires and the sixth wires; and
a plurality of seventh connection conductors connecting the fifth wires and the sixth wires, and
wherein the fourth coil includes:
a plurality of the seventh wires provided on the first board;
a plurality of the eighth wires provided on the second board;
a plurality of the fourth connection conductors connecting the seventh wires and the eighth wires; and
a plurality of eighth connection conductors connecting the seventh wires and the eighth wires.

14. The current detection device according to claim 13,
wherein each of the one ends of the second wires is provided right above each of the one ends of the first wires,
wherein each of the other ends of the second wires is provided right above each of the other ends of the first wires,
wherein each of the one ends of the fourth wires is provided right above each of the one ends of the third wires,
wherein each of the other ends of the fourth wires is provided right above each of the other ends of the third wires,
wherein each of the one ends of the sixth wires is provided right above each of the one ends of the fifth wires,
wherein each of the other ends of the sixth wires is provided right above each of the other ends of the fifth wires,
wherein each of the one ends of the eighth wires is provided right above each of the one ends of the seventh wires,
wherein each of the other ends of the eighth wires is provided right above each of the other ends of the seventh wires,
wherein the first connection conductors connect the one ends of the first wires and the one ends of the second wires,
wherein the fifth connection conductors connect the other ends of the first wires and the other ends of the second wires,
wherein the second connection conductors connect the one ends of the third wires and the one ends of the fourth wires, wherein the sixth connection conductors connect the other ends of the third wires and the other ends of the fourth wires, wherein the third connection conductors connect the one ends of the fifth wires and the one ends of the sixth wires, wherein the seventh connection conductors connect the other ends of the fifth wires and the other ends of the sixth wires, wherein the fourth connection conductors connect the one ends of the seventh wires and the one ends of the eighth wires, and wherein the eighth connection conductors connect the other ends of the seventh wires and the other ends of the eighth wires.

15. The current detection device according to claim 13, wherein the first wire and the third wire are parallel to each other, wherein the second wire and the fourth wire are parallel to each other, wherein the fifth wire and the seventh wire are parallel to each other, and wherein the sixth wire and the eighth wire are parallel to each other.

16. The current detection device according to claim 13, wherein the first wires are parallel to each other,
wherein the second wires are parallel to each other,
wherein the third wires are parallel to each other,
wherein the fourth wires are parallel to each other,
wherein the fifth wires are parallel to each other,
wherein the sixth wires are parallel to each other,
wherein the seventh wires are parallel to each other, and
wherein the eighth wires are parallel to each other.

17. A current detection device comprising:
a first board;
a second board provided above the first board in parallel to the first board;
a magnetic measurement element provided on the second board;
a first coil having at least one of a first wire provided on the first board or a second wire provided on the second board and having a first connection conductor connected to the first wire provided on the first board or the second wire provided on the second board; and
a second coil having at least one of a third wire provided on the first board or a fourth wire provided on the second board and having a second connection conductor connected to the third wire provided on the first board or the fourth wire provided on the second board, the second coil being connected to the first coil such that magnetic fields generated in the first coil and the second coil by a current for electrically conducting the first coil and the second coil have the same direction.

18. The current detection device according to claim 17, wherein the first coil includes:
a plurality of the first wires provided on the first board;
a plurality of the second wires provided on the second board;
a plurality of the first connection conductors connecting the first wires and the second wires; and
a plurality of third connection conductors connecting the first wires and the second wires, and
wherein the second coil includes:
a plurality of the third wires provided on the first board;
a plurality of the fourth wires provided on the second board;
a plurality of the second connection conductors connecting the third wires and the fourth wires; and
a plurality of fourth connection conductors connecting the third wires and the fourth wires.

19. The current detection device according to claim 18, wherein each of the one ends of the second wires is provided right above each of the one ends of the first wires,
wherein each of the other ends of the second wires is provided right above each of the other ends of the first wires,
wherein each of the one ends of the fourth wires is provided right above each of the one ends of the third wires,
wherein each of the other ends of the fourth wires is provided right above each of the other ends of the third wires,
wherein the first connection conductors connect the one ends of the first wires and the one ends of the second wires,
wherein the third connection conductors connect the other ends of the first wires and the other ends of the second wires,
wherein the second connection conductors connect the one ends of the third wires and the one ends of the fourth wires, and
wherein the fourth connection conductors connect the other ends of the third wires and the other ends of the fourth wires.

20. The current detection device according to claim 18, wherein the first wire and the third wire are parallel to each other, and
wherein the second wire and the fourth wire are parallel to each other.

* * * * *